United States Patent
Qin

(10) Patent No.: US 8,961,689 B2
(45) Date of Patent: Feb. 24, 2015

(54) SYSTEMS AND METHODS FOR DISTRIBUTING GAS IN A CHEMICAL VAPOR DEPOSITION REACTOR

(75) Inventor: Wenjun Qin, Missoula, MT (US)

(73) Assignee: GTAT Corporation, Merrimack, NH (US)

( * ) Notice: Subject to any disclaimer, the term of this patent is extended or adjusted under 35 U.S.C. 154(b) by 793 days.

(21) Appl. No.: 12/934,393

(22) PCT Filed: Mar. 26, 2009

(86) PCT No.: PCT/US2009/038393
§ 371 (c)(1),
(2), (4) Date: Feb. 10, 2011

(87) PCT Pub. No.: WO2009/120862
PCT Pub. Date: Oct. 1, 2009

(65) Prior Publication Data
US 2011/0129621 A1    Jun. 2, 2011

Related U.S. Application Data

(60) Provisional application No. 61/039,758, filed on Mar. 26, 2008.

(51) Int. Cl.
*C23C 16/24* (2006.01)
*C23C 16/455* (2006.01)
(Continued)

(52) U.S. Cl.
CPC ............... *C23C 16/24* (2013.01); *C30B 28/12* (2013.01); *C23C 16/46* (2013.01); *C01B 33/035* (2013.01); *C23C 16/45563* (2013.01)
USPC .............. 118/715; 118/724; 118/725; 117/88

(58) Field of Classification Search
CPC ........ C30B 25/00; C30B 25/02; C30B 25/10; C30B 28/00; C30B 28/12; C30B 28/14; C23C 16/00; C23C 16/0209; C23C 16/24; C23C 16/26; C23C 16/30; C23C 16/303; C23C 16/32; C23C 16/325; C23C 16/34; C23C 16/345; C23C 16/40; C23C 16/401; C23C 16/402; C23C 16/42; C23C 16/4418; C23C 16/455; C23C 16/45563; C23C 16/45578; C23C 16/458; C23C 16/4587; C23C 16/4581; C23C 16/46; C01B 33/035
USPC .............. 118/715, 724, 725; 117/84, 88, 200; 427/255.11, 255.18, 255.28; 438/488, 438/490

See application file for complete search history.

(56) References Cited

U.S. PATENT DOCUMENTS

| 3,058,812 A | 10/1962 | Chu et al. |
| 3,120,451 A * | 2/1964 | Sirtl et al. ...................... 117/89 |

(Continued)

FOREIGN PATENT DOCUMENTS

| EP | 1162652 A2 | 12/2001 |
| EP | 1162652 A2 | 12/2001 |

(Continued)

OTHER PUBLICATIONS

Machine translation of JP 05293965 A.*

(Continued)

*Primary Examiner* — Jeffrie R Lund
(74) *Attorney, Agent, or Firm* — Maine Cernota & Rardin

(57) ABSTRACT

Systems and methods for the production of polysilicon or another material via chemical vapor deposition in a reactor are provided in which gas is distributed using a silicon standpipe. The silicon standpipe can be attached to the reactor system using a nozzle coupler such that precursor gases may be injected to various portions of the reaction chamber. As a result, gas flow can be improved throughout the reactor chamber, which can increase the yield of polysilicon, improve the quality of polysilicon, and reduce the consumption of energy.

17 Claims, 4 Drawing Sheets

(51) Int. Cl.
*C23C 16/46* (2006.01)
*C01B 33/035* (2006.01)
*C30B 28/12* (2006.01)

(56) References Cited

U.S. PATENT DOCUMENTS

| | | | | |
|---|---|---|---|---|
| 3,293,950 | A * | 12/1966 | Kern et al. | 76/107.1 |
| 3,746,496 | A * | 7/1973 | Dietze et al. | 425/447 |
| 3,918,396 | A * | 11/1975 | Dietze et al. | 118/725 |
| 3,941,900 | A * | 3/1976 | Stut et al. | 423/349 |
| 4,023,520 | A * | 5/1977 | Reuschel | 118/665 |
| 4,062,714 | A * | 12/1977 | Griesshammer et al. | 156/304.6 |
| 4,068,020 | A * | 1/1978 | Reuschel | 438/482 |
| 4,125,643 | A * | 11/1978 | Reuschel et al. | 427/9 |
| 4,147,814 | A * | 4/1979 | Yatsurugi et al. | 427/588 |
| 4,148,931 | A * | 4/1979 | Reuschel et al. | 427/8 |
| 4,150,168 | A * | 4/1979 | Yatsurugi et al. | 427/588 |
| 4,173,944 | A * | 11/1979 | Koppl et al. | 118/719 |
| 4,179,530 | A * | 12/1979 | Koppl et al. | 427/545 |
| 4,255,463 | A * | 3/1981 | Rucha et al. | 427/588 |
| 4,311,545 | A * | 1/1982 | Bugl et al. | 117/102 |
| 4,374,110 | A * | 2/1983 | Darnell et al. | 423/342 |
| 4,409,195 | A * | 10/1983 | Darnell et al. | 423/342 |
| 4,426,408 | A * | 1/1984 | Dietze | 423/348 |
| 4,481,232 | A * | 11/1984 | Olson | 427/588 |
| 4,681,652 | A * | 7/1987 | Rogers et al. | 117/88 |
| 4,715,317 | A * | 12/1987 | Ishizuka | 118/719 |
| 4,805,556 | A * | 2/1989 | Hagan et al. | 118/725 |
| 5,064,367 | A | 11/1991 | Philipossian | |
| 5,327,454 | A * | 7/1994 | Ohtsuki et al. | 373/133 |
| 5,374,413 | A * | 12/1994 | Kim et al. | 423/349 |
| 5,382,412 | A * | 1/1995 | Kim et al. | 422/142 |
| 5,382,419 | A * | 1/1995 | Nagai et al. | 423/348 |
| 5,478,396 | A * | 12/1995 | Keck et al. | 118/719 |
| 5,545,387 | A | 8/1996 | Keck et al. | |
| 5,885,358 | A | 3/1999 | Maydan et al. | |
| 6,007,869 | A * | 12/1999 | Schreieder et al. | 427/213 |
| 6,073,577 | A * | 6/2000 | Lilleland et al. | 118/723 E |
| 6,123,775 | A * | 9/2000 | Hao et al. | 118/724 |
| RE36,936 | E * | 10/2000 | Keck et al. | 423/348 |
| 6,221,155 | B1 * | 4/2001 | Keck et al. | 117/105 |
| 6,284,312 | B1 * | 9/2001 | Chandra et al. | 427/237 |
| 6,365,225 | B1 * | 4/2002 | Chandra et al. | 427/237 |
| 6,544,333 | B2 * | 4/2003 | Keck et al. | 117/200 |
| 6,639,192 | B2 * | 10/2003 | Hertlein et al. | 219/541 |
| 6,716,302 | B2 | 4/2004 | Carducci et al. | |
| 6,749,824 | B2 * | 6/2004 | Keck et al. | 423/348 |
| 6,872,259 | B2 | 3/2005 | Strang | |
| 6,902,622 | B2 | 6/2005 | Johnsgard et al. | |
| 7,217,336 | B2 | 5/2007 | Strang | |
| 7,323,047 | B2 | 1/2008 | Sugawara et al. | |
| 7,645,341 | B2 * | 1/2010 | Kennedy et al. | 118/715 |
| 7,923,358 | B2 * | 4/2011 | Kim et al. | 438/488 |
| 8,034,300 | B2 * | 10/2011 | Ishii | 422/199 |
| 8,043,470 | B2 * | 10/2011 | Hardin et al. | 156/345.34 |
| 8,216,643 | B2 * | 7/2012 | Kim et al. | 427/255.11 |
| 8,430,959 | B2 * | 4/2013 | Kim et al. | 117/89 |
| 8,647,432 | B2 * | 2/2014 | Wan et al. | 117/25 |
| 8,652,258 | B2 * | 2/2014 | Yokogawa et al. | 118/715 |
| 2002/0014197 | A1 * | 2/2002 | Keck et al. | 117/87 |
| 2003/0021894 | A1 * | 1/2003 | Inoue et al. | 427/248.1 |
| 2003/0127045 | A1 * | 7/2003 | Keck et al. | 117/200 |
| 2004/0021068 | A1 * | 2/2004 | Staats | 250/288 |
| 2006/0180275 | A1 * | 8/2006 | Steger | 156/345.34 |
| 2006/0185589 | A1 | 8/2006 | Zehavi et al. | |
| 2006/0196603 | A1 | 9/2006 | Lei et al. | |
| 2007/0187363 | A1 | 8/2007 | Oka et al. | |
| 2007/0251455 | A1 * | 11/2007 | Wan et al. | 118/724 |
| 2008/0206970 | A1 * | 8/2008 | Hugo et al. | 438/488 |
| 2009/0081380 | A1 * | 3/2009 | Endoh et al. | 427/545 |
| 2009/0130333 | A1 * | 5/2009 | Kim et al. | 427/545 |
| 2009/0191336 | A1 * | 7/2009 | Chandra et al. | 427/248.1 |
| 2010/0040803 | A1 * | 2/2010 | Kim et al. | 427/588 |
| 2010/0041215 | A1 * | 2/2010 | Kim et al. | 438/488 |
| 2010/0221454 | A1 * | 9/2010 | Kim et al. | 427/588 |
| 2010/0247766 | A1 * | 9/2010 | Forrest et al. | 427/255.23 |
| 2011/0129621 | A1 * | 6/2011 | Qin | 427/585 |
| 2011/0159214 | A1 * | 6/2011 | Gum et al. | 427/587 |
| 2011/0229638 | A1 * | 9/2011 | Qin | 427/255.28 |
| 2011/0274926 | A1 * | 11/2011 | Oda et al. | 428/378 |
| 2013/0302528 | A1 * | 11/2013 | Kurosawa et al. | 427/457 |

FOREIGN PATENT DOCUMENTS

| | | | | |
|---|---|---|---|---|
| JP | 63074909 | A1 * | 4/1988 | |
| JP | 05139891 | A * | 6/1993 | C30B 29/06 |
| JP | 05293965 | A * | 11/1993 | B41J 2/135 |
| JP | 2002508294 | A | 3/2002 | |
| RU | 2023050 | C1 | 11/1994 | |
| RU | 2125620 | C1 | 1/1999 | |
| WO | WO-9931013 | | 6/1999 | |
| WO | 2006091413 | | 8/2006 | |
| WO | WO-2006091413 | | 8/2006 | |
| WO | WO 2007136209 | A1 * | 11/2007 | |

OTHER PUBLICATIONS

International Search Report and Written Opinion for PCT/US09/038393 mailed Dec. 11, 2009, 9 pages.
Chinese Office action No. 1 on Patent Application No. 200980116944.2, dated Feb. 6, 2012, 8 pages.
Chinese Office action No. 2 on Patent Application No. 200980116944.2, dated Sep. 4, 2012, 12 pages.
Russian Office action on Patent Application No. 2010143559/02, dated Apr. 8, 2013, 5 pages.
Official Action for Japanese Application 2011-502054, dated Sep. 3, 2013, 2 pages.

* cited by examiner

SYSTEMS AND METHODS FOR DISTRIBUTING GAS IN A CHEMICAL VAPOR DEPOSITION REACTOR

This application is a national phase application filed under 35 USC §371 of PCT Application No. PCT/US2009/038393 with an International filing date of Mar. 26, 2009 which claims priority of U.S. Provisional Application Ser. No. 61/039,758 filed on Mar. 26, 2008. Each of these applications is herein incorporated by reference in their entirety for all purposes.

FIELD OF INVENTION

The subject invention is directed to systems and methods for the production of materials such as polysilicon via chemical vapor deposition in a reactor. More particularly, the subject invention relates to systems and methods for distributing gas to improve flow patterns in a chemical vapor deposition reactor using a silicon standpipe.

DESCRIPTION OF THE RELATED ART

Chemical vapor deposition (CVD) refers to reactions usually occurring in a reaction chamber that involve depositing a solid material from a gaseous phase. CVD can be used to produce high-purity, high-performance, solid materials such as polysilicon, silicon dioxide, and silicon nitride, for example. In the semiconductor and photovoltaic industries, CVD is often used to produce thin films and bulk semiconductor materials. For example, heated surfaces can be exposed to one or more gases. As the gases are delivered into the reaction chamber, they come into contact with heated surfaces. Once this occurs, reactions or decomposition of the gases then occurs forming a solid phase, which is deposited onto the substrate surface to produce the desired material. Critical to this process is the gas flow pattern which influences the rate at which these reactions will take place and the quality of the products.

In polysilicon chemical vapor deposition processes, for example, polycrystalline silicon can be deposited from silane ($SiH_4$), dichlorosilane ($SiH_2Cl_2$), trichlorosilane ($SiHCl_3$), and tetrachlorosilane ($SiCl_4$) according to the respective reactions. These reactions are usually performed in a vacuum or a pressured CVD reactor, with either pure silicon-containing feedstock, or a mixture of silicon containing feedstock with other gases. The required temperatures for the reactions range from hundreds to over one thousand degrees Celsius. Polysilicon may also be grown directly with doping, if gases such as phosphine, arsine or diborane are added to the CVD chamber.

Gas flow pattern is therefore crucial not only to the growth of polysilicon and other materials, but it also impacts the production rate, product quality, and energy consumption of the overall CVD reactor system.

SUMMARY OF THE INVENTION

The subject invention relates to systems and methods for distributing gas in a chemical vapor deposition reactor, in particular, for improving gas flow in a CVD reactor. Thus, the subject invention can be used to increase efficiency of reactions within CVD reaction chambers, increase the output of solid deposit, improve product quality, and reduce overall operating costs. Also encompassed by the subject invention is that silicon deposited on standpipes in a CVD reactor can be used as additional polysilicon product.

In a reactor system and method according to the subject invention, in particular, a CVD reactor system and method, a standpipe is utilized. The standpipe can be used to inject various reactants into a reaction chamber. The standpipe preferably is made of silicon or other materials. These materials include, without limitation: metals, graphite, silicon carbide, and other suitable materials. The length of the standpipe can range from about 1-2 centimeters up to about a few meters depending on the application. The diameter of the pipe can range from about 1-2 millimeters up to tenths of centimeters depending on the gas flow rate. The thickness of the wall preferably is about 0.1 to about 5.0 millimeters.

The reactor system of the subject invention includes a reaction chamber having at least a base plate fixed within the reaction chamber and an enclosure operably connected to the base plate. One or more filaments are attached to the base plate within the chamber upon which various reactant gases are deposited during a chemical vapor deposition cycle. The filament may be a silicon filament or other desired solid to be fabricated. At least one gas inlet and one gas outlet are connected to the reaction chamber to allow gas flow through the reaction chamber. A window portion or viewing port for viewing an internal portion of the chamber also can be provided. An electrical current source preferably is connected to ends of the filament via electrical feedthroughs in the base plate for supplying a current to heat the filament directly during a CVD reaction cycle. A cooling system for lowering a temperature of the chemical vapor deposition system also can be employed having at least one fluid inlet and at least one fluid outlet.

The standpipe according to the subject invention preferably is operably connected to the at least one gas inlet for injecting gas flow to the reaction chamber. The standpipe preferably includes a nozzle coupler and a pipe body. The length and diameter of the pipe body can be selected based on at least a desired gas flow rate. The nozzle coupler further can include a sealing device such as a gasket for sealing the pipe body to the at least one gas inlet. The standpipe preferably has at least one injection tube within the chamber for distributing a process gas flow. The dimensions of the at least one injection tube are based on a desired flow rate. The injection tube material can be made of silicon or another material.

These and other aspects and advantages of the subject invention will become more readily apparent from the following description of the preferred embodiments taken in conjunction with the drawings.

BRIEF DESCRIPTION OF THE DRAWINGS

So that those skilled in the art to which the subject invention appertains will readily understand how to make and use the method and device of the subject invention without undue experimentation, preferred embodiments thereof will be described in detail herein below with reference to certain figures, wherein.

DETAILED DESCRIPTION OF THE INVENTION

Figure 1:
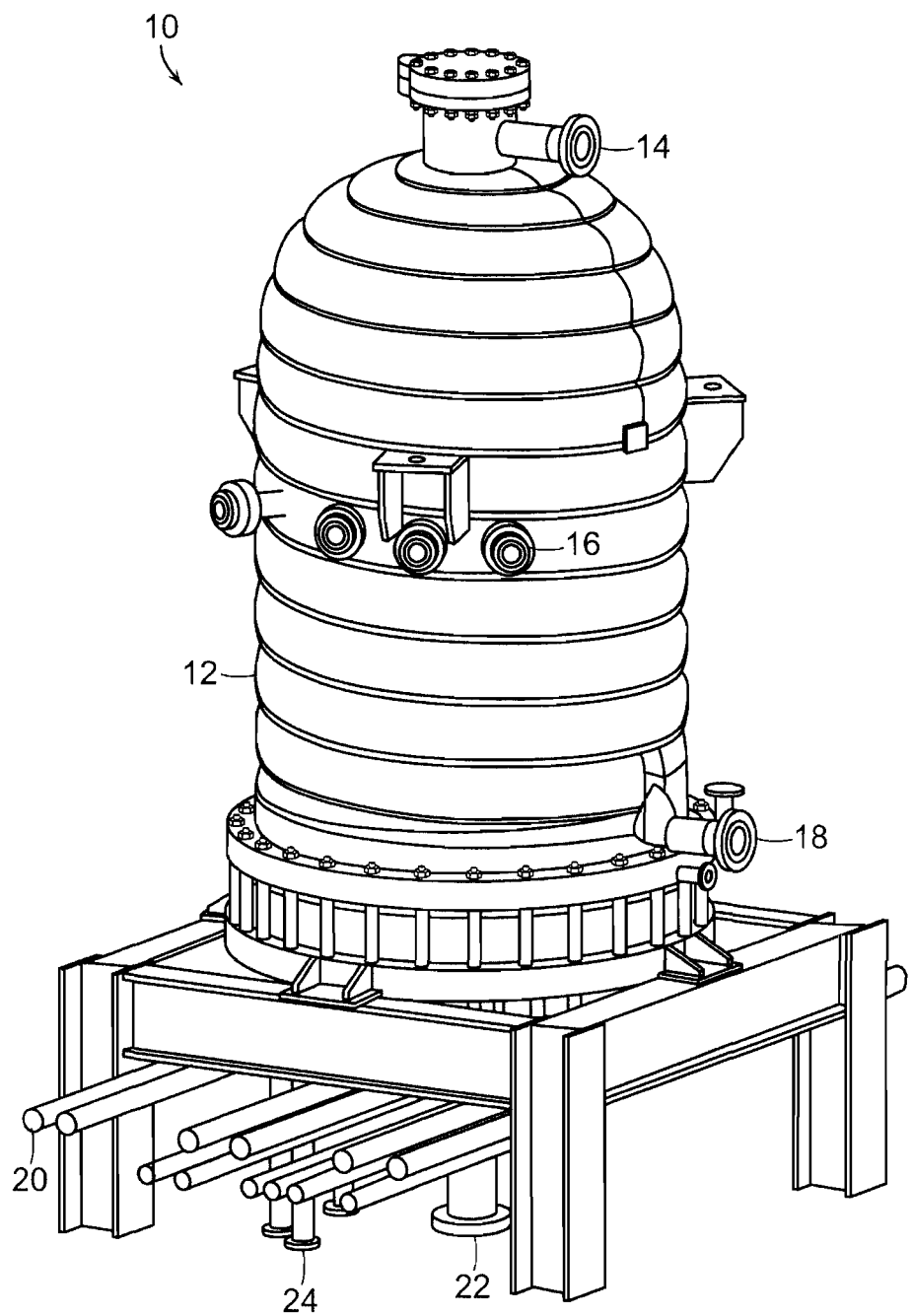
FIG. 1 is a perspective view of a reaction chamber system of the subject invention.

Preferred embodiments of the subject invention are described below with reference to the accompanying drawings, in which like reference numerals represent the same or similar elements.

The subject invention relates to systems and methods for distributing gas in a reactor, in particular, for improving gas flow in a chemical vapor deposition (CVD) reactor. In particular, the subject invention is directed to a system and method for distributing gas in a CVD reactor using a standpipe. The benefits and advantages of the subject invention include, but are not limited to, increased production rates of a solid deposit (e.g. polysilicon), decreased energy consumption, and reduced overall operating costs. While the disclosure of the subject invention is directed toward an exemplary polysilicon CVD reactor system, the system and methods of the subject invention can be applied to any CVD reactor system for which increased gas distribution and improved gas flow patterns are desired, or any reactor system generally.

In an exemplary application, trichlorosilane gas reacts on rods or silicon tube filaments within a reaction chamber to form polysilicon deposits on the thin rods or filaments. The subject invention is not restricted to CVD reactors using polysilicon deposition involving a reaction of trichlorosilane but can be used for reactions involving silane, dichlorosilane, silicon tetrachloride, or other derivatives or combinations of gases, for example, by using thin rods or filaments with large surface area geometries and similar electrical resistivity properties in accordance with the invention. Filaments of various shapes and configurations can be utilized, for example, those disclosed in U.S. Patent Application Publication US 2007/0251455, which is incorporated herein by reference.

Figure 2:
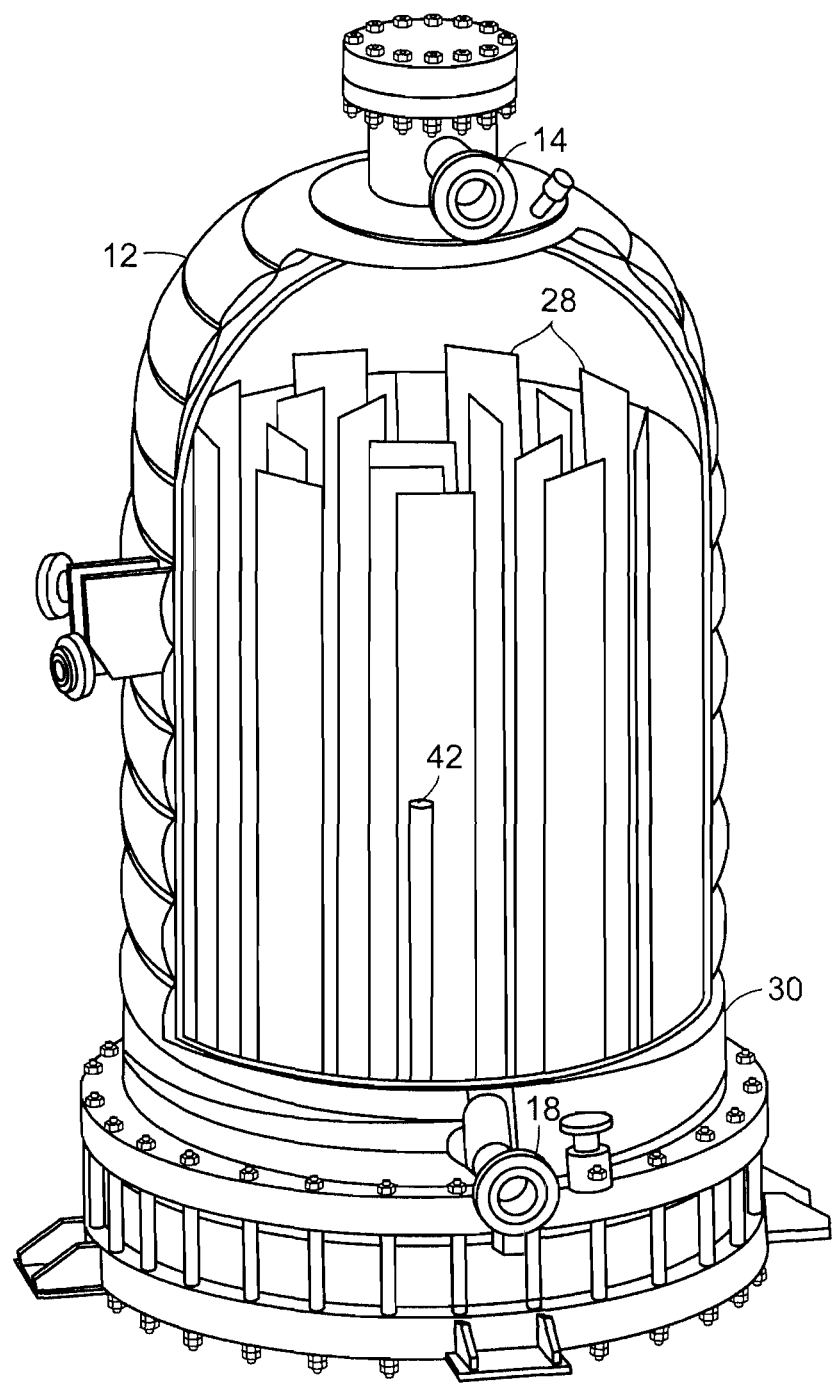
FIG. 2 is an internal perspective view of the reaction chamber of FIG. 1.

Referring to FIGS. 1 and 2, a chemical vapor deposition (CVD) reactor is shown, in which polysilicon is deposited onto thin rods or filaments according to the subject invention. A reactor system 10 includes a reaction chamber 12 having a base plate 30, a gas inlet nozzle 24 or process flange, a gas outlet nozzle 22 or exhaust flange, and electrical feedthroughs or conductors 20 for providing a current to directly heat one or more filaments 28 within the reaction chamber 12, as shown in FIG. 2. A fluid inlet nozzle 18 and a fluid outlet nozzle 14 are connected to a cooling system for providing fluid to the reaction chamber 10. In addition, a viewing port 16 or sight glass preferably allows visual inspection of the interior of the reaction chamber 12, and can optionally be used to obtain temperature measurements inside the reaction chamber 12.

According to a preferred embodiment of the subject invention as depicted in FIGS. 1 and 2, the reactor system 10 is configured for bulk production of polysilicon. The system includes the base plate 30 that may, for example, be a single plate or multiple opposing plates, preferably configured with filament supports, and an enclosure attachable to the base plate 30 so as to form a deposition chamber. As used herein, the term "enclosure" refers to an inside of the reaction chamber 12, where a CVD process can occur.

One or more silicon filaments 28 preferably are disposed within the reaction chamber 12 on filament supports (not shown), and an electrical current source is connectible to both ends of the filaments 28 via electrical feedthroughs 20 in the base plate 30, for supplying a current to directly heat the filaments. Further provided is at least one gas inlet nozzle 24 in the base plate 30 connectible to a source of silicon-containing gas, for example, and a gas outlet nozzle 22 in the base plate 30 whereby gas may be released from the reaction chamber 12.

Figure 3A:
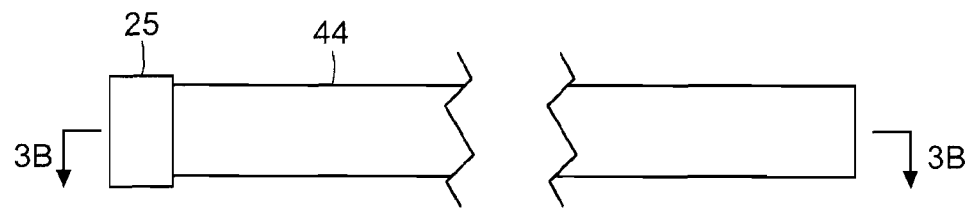
FIG. 3A is an enlarged cutaway view of a standpipe according to the subject invention.
Figure 4:
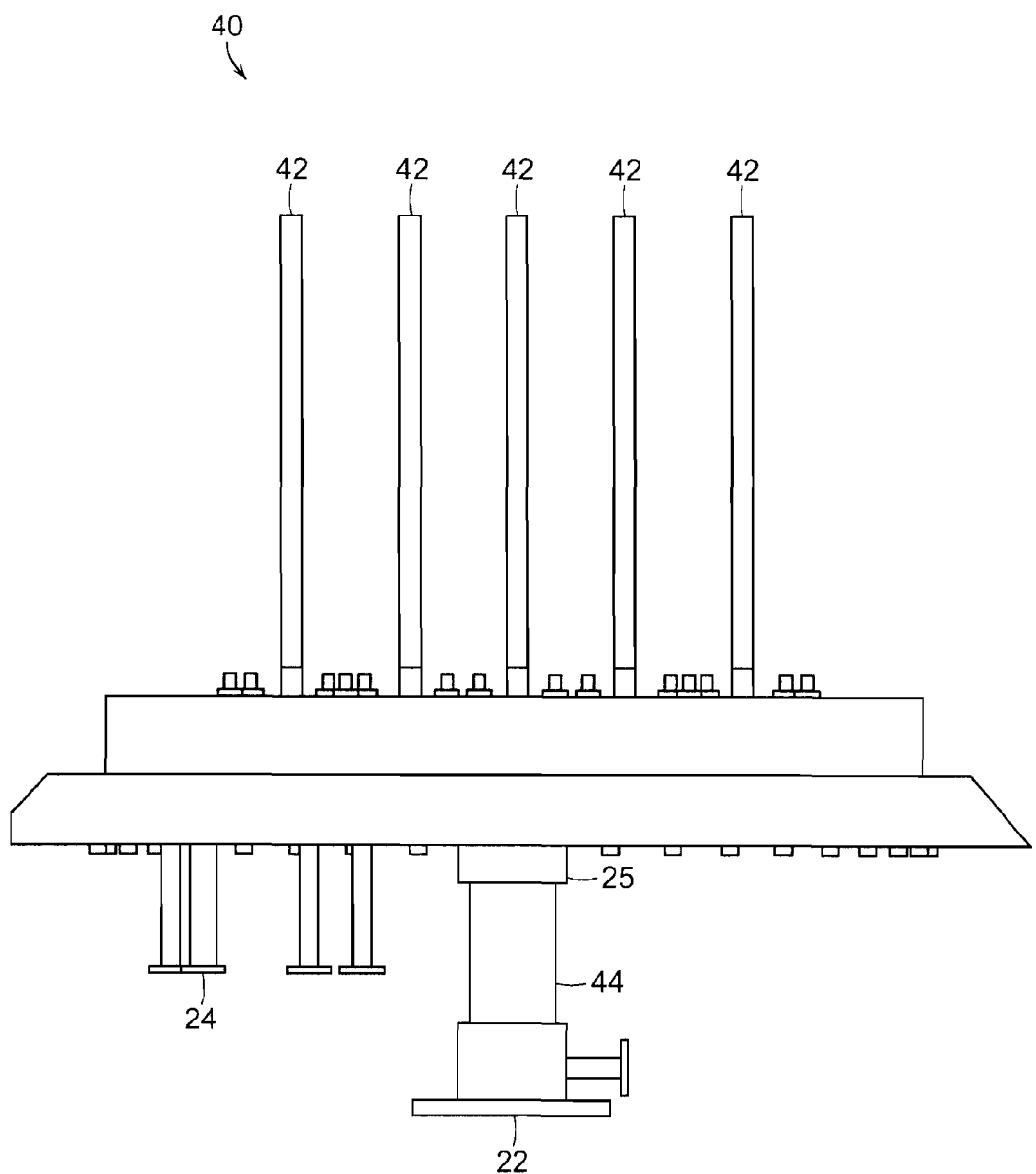
FIG. 4 is a partial cross-sectional view of the reaction chamber system of the subject invention incorporating multiple standpipes.

Referring to FIG. 2, an exemplary standpipe 42 structure is shown, in which a pipe body 44 preferably is operably connected to at least one gas inlet nozzle 24 for injecting various gases into the reaction chamber 12 in conjunction with a CVD reaction occurring in the reaction chamber 12 (see also FIG. 3A). Although a single injection tube 42 is depicted in FIG. 2, one or more standpipes can be included in a reaction chamber. For example, referring to FIG. 4, the single standpipe can be replaced by standpipes 42. The dimensions of each standpipe or injection tube 42 may vary from about 1-2 cm in length up to a few meters, and about 1-2 mm in diameter to tenths of centimeters, depending upon a desired gas flow design.

The one or more standpipes 42 preferably are used to inject one or more gases to various parts of the reaction chamber 12, depending upon a desired flow pattern. The standpipe(s) 42 can be attached to the reactor by any known installation mechanism, for example, by screwing a pipe body 44 into an inlet nozzle coupler 25 of the reaction chamber 12 (see FIGS. 3A-3C, as described herein). Because gas flow patterns can be crucial to the growth, production rate, product quality, and energy consumption of polysilicon, the subject invention can be applied to polysilicon manufacturing processes and any other processes that involve silicon or silicon compound deposition. Specifically, it can also be applied to processes where corrosion, contamination, and deposition can occur on the pipe and other shapes of components.

Figure 3B:
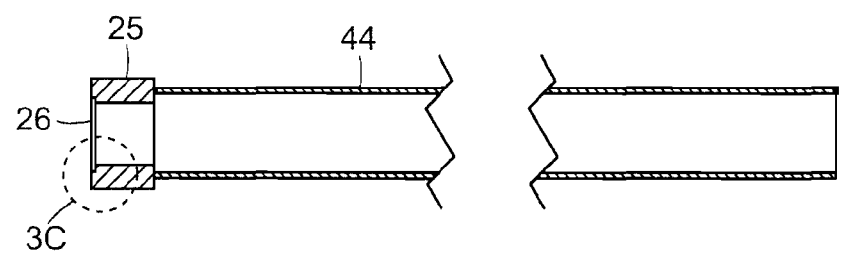
FIG. 3B is a detailed view of a nozzle coupler attached to a pipe body of the standpipe of FIG. 3A.
Figure 3C:
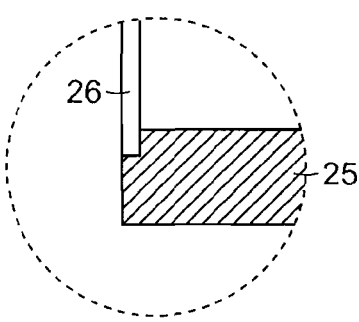
FIG. 3C is an enlarged view of a gasket of the nozzle coupler depicted in FIG. 3B.

Referring again to FIGS. 3A-3C, various components of the standpipe 42 preferably are made of silicon pipe. Silicon is used as an alternative to non-silicon materials such as stainless steel or other metals that can cause corrosion, contamination, melting and unwanted silicon deposition within the pipe body 44. At one end of the pipe body 44, the material from which the pipe body 44 is made is fused with materials that can be machined. These materials include metals, graphite, silicon carbide, and any other suitable material. At the other end, as shown in FIGS. 3A-3C, the pipe body 44 preferably is attached to the nozzle coupler 25 having an appropriate diameter. The nozzle coupler 25 preferably is formed with a gasket 26 for providing an airtight seal between the gas inlet nozzle 24 and a standpipe gas supply source. The length of the pipe body 44 can range from about a few centimeters to about a few meters depending on the application. The diameter of the pipe body 44 can range from about a few millimeters to tenths of centimeters depending on the gas flow rate. The thickness of the pipe body 44 wall preferably is on the order of about a few millimeters or less. The pipe body 44 preferably is made of silicon.

A method for depositing a material in a reactor can include steps of: providing a reaction chamber including at least a base plate fixed within the reaction chamber and an enclosure operably connected to the base plate; attaching at least one filament to the base plate; connecting an electrical current source to the reaction chamber for supplying a current to the filament; connecting a gas source to the reaction chamber to allow gas through the reaction chamber; connecting a standpipe to the gas source for distributing a gas flow within the reaction chamber; and operating the reactor to deposit the material on the at least one filament in the reaction chamber.

An additional benefit of a standpipe of the subject invention is that it can be reused or recycled. During the gas injection process, silicon is deposited on the pipe body 44. Once the silicon builds up, the silicon can be removed from the pipe bases and used as silicon product.

Although the subject invention has been described with respect to preferred embodiments, those skilled in the art will readily appreciated that changes or modifications thereto may be made without departing from the spirit or scope of the subject invention as defined by the appended claims.

INCORPORATION BY REFERENCE

The entire contents of all patents, published patent applications and other references cited herein are hereby expressly incorporated herein in their entireties by reference.

What is claimed is:

1. A silicon reactor system, comprising:
a reaction chamber including at least a base plate fixed within the reaction chamber and an enclosure operably connected to the base plate;
at least one silicon filament attached to the base plate;
an electrical current source connected to ends of the at least one filament for supplying a current to the at least one filament;
a gas source operably connected to the reaction chamber to allow a silicon-containing gas to flow through the reaction chamber; and
a standpipe comprising a pipe body having (i) an inlet end operably connected to the gas source and (ii) an outlet end exposed within the reaction chamber for directly injecting the gas flow into the reaction chamber, said outlet end being a termination of said pipe body that does not add structure to said pipe body, said outlet end being located at a height above the ends of the at least one filament that are connected to the electrical current source, said standpipe comprising silicon and being configured to receive deposits of polysilicon in the reaction chamber.

2. The reactor system of claim 1, wherein the current is supplied directly to the filament through an electrical feedthrough in the base plate.

3. The reactor system of claim 1, wherein the reaction chamber further comprises a viewing port for viewing an internal portion of the reaction chamber.

4. The reactor system of claim 1, further comprising at least one additional standpipe received in the reaction chamber.

5. The reactor system of claim 1, wherein the inlet end of the standpipe terminates in a nozzle coupler, the nozzle coupler being configured for connecting with the gas source.

6. The reactor system of claim 5, wherein a diameter of the pipe body is selected based on at least a desired gas flow rate.

7. The reactor system of claim 5, wherein the nozzle coupler further comprises a gasket for sealing the standpipe to the gas source.

8. The reactor system of claim 1, wherein the reactor system is a chemical vapor deposition reactor system.

9. The reactor system of claim 1, further comprising a cooling system having at least a fluid inlet and a fluid outlet operably connected to the reactor system.

10. The silicon reactor system of claim 1, wherein the inlet end of the standpipe is operably connected to the gas source and to the base plate by a connecting mechanism that facilitates removal of the standpipe from the reactor.

11. A reaction chamber, comprising:
a base plate fixed within the reaction chamber;
at least one filament having ends attached to the base plate, the reaction chamber being operably connected to an electrical current source and a gas source to allow deposition of a material on the at least one filament; and
a standpipe comprising a pipe body having (i) an inlet end operably attached to the gas source and (ii) an outlet end exposed within the reaction chamber for directly distributing a gas flow within the reaction chamber, said outlet end being a termination of said pipe body that does not add structure to said pipe body, said outlet end being located at a height above the ends of the at least one filament that are attached to the base plate, said standpipe comprising the material to be deposited on the filament and being configured to receive deposits of the material in the reaction chamber.

12. The reaction chamber of claim 11, wherein a current is supplied to the filament by the electrical current source.

13. The reaction chamber of claim 12, wherein the current is supplied directly to the filament through an electrical feedthrough in the base plate.

14. The reaction chamber of claim 11, further comprising at least a gas inlet and a gas outlet operably connected to the reaction chamber to allow gas flow through the reaction chamber.

15. The reaction chamber of claim 11, further comprising a viewing port for viewing an internal portion of the reaction chamber.

16. The reactor system of claim 11, wherein the inlet end of the standpipe is operably connected to the gas source and to the base plate by a connecting mechanism that facilitates removal of the standpipe from the reactor.

17. A silicon reactor system, comprising:
a reaction chamber including at least a base plate fixed within the reaction chamber and an enclosure operably connected to the base plate;
at least one silicon filament attached to the base plate;
an electrical current source connected to ends of the at least one filament for supplying a current to the at least one filament;
a gas source operably connected to the reaction chamber to allow a silicon-containing gas to flow through the reaction chamber; and
a standpipe comprising a pipe body having (i) an inlet end operably connected to the gas source and to the base plate by a mechanism that facilitates removal of the standpipe from the reactor, and (ii) an outlet end exposed within the reaction chamber for directly injecting the gas flow into the reaction chamber, said outlet end being a termination of said pipe body that does not add structure to said pipe body, said outlet end being located at a height above the ends of the at least one filament that are connected to the electrical current source, said standpipe comprising silicon and being configured to receive deposits of polysilicon in the reaction chamber.

* * * * *